(12) United States Patent
Zelikson et al.

(10) Patent No.: US 10,228,738 B2
(45) Date of Patent: Mar. 12, 2019

(54) METHODS AND SYSTEMS TO CONTROL POWER GATES DURING AN ACTIVE STATE OF A GATED DOMAIN BASED ON LOAD CONDITIONS OF THE GATED DOMAIN

(75) Inventors: Michael Zelikson, Haifa (IL); Vjekoslav Svilan, Sunnyvale, CA (US); Norbert Unger, Deisenhofen (DE); Shai Rotem, Haifa (IL)

(73) Assignee: Intel Corporation, Santa Clara, CA (US)

( * ) Notice: Subject to any disclaimer, the term of this patent is extended or adjusted under 35 U.S.C. 154(b) by 692 days.

(21) Appl. No.: 14/350,548

(22) PCT Filed: Dec. 27, 2011

(86) PCT No.: PCT/US2011/067334
§ 371 (c)(1),
(2), (4) Date: Sep. 3, 2014

(87) PCT Pub. No.: WO2013/100890
PCT Pub. Date: Jul. 4, 2013

(65) Prior Publication Data
US 2015/0149794 A1 May 28, 2015

(51) Int. Cl.
*G06F 1/00* (2006.01)
*G06F 1/26* (2006.01)
(Continued)

(52) U.S. Cl.
CPC ............ *G06F 1/26* (2013.01); *G06F 1/3243* (2013.01); *G06F 1/3287* (2013.01);
(Continued)

(58) Field of Classification Search
None
See application file for complete search history.

(56) References Cited

U.S. PATENT DOCUMENTS 4,649,291 A 3/1987 Konishi
5,773,966 A 6/1998 Steigerwald
(Continued)

FOREIGN PATENT DOCUMENTS

KR 20030076668 9/2003
KR 100785150 12/2007
(Continued)

OTHER PUBLICATIONS

Allowance Decision of Examination for Taiwan Patent Application No. 101149598, dated Jul. 21, 2015.
(Continued)

*Primary Examiner* — Nitin Patel
(74) *Attorney, Agent, or Firm* — Green, Howard & Mughal LLP

(57) ABSTRACT

Methods and systems to adjust a resistance between a supply grid and a power-gated grid during an active state of a power-gated circuitry in response to load changes in the circuitry to maintain a relatively consistent IR droop. Subsets of power gates (PGs) may be selectively enabled and disabled based on changes in a load factor, such as a voltage, which may be monitored at a gated power distribution grid and/or proximate to a transistor gate within the power-gated circuitry. The adjusting may be performed to minimize a difference between the monitored voltage and a reference, such as with successive approximation or CMS software. PG subsets may be distributed within one or more layers of an integrated circuit (IC) die and may be selectively enabled/disabled based on location. PGs may be embedded within lower layers of an integrated circuit (IC) die, such as within metal layers of the IC die.

27 Claims, 8 Drawing Sheets

(51) Int. Cl.
 *H03K 17/687* (2006.01)
 *G06F 1/3234* (2019.01)
 *G06F 1/3287* (2019.01)

(52) U.S. Cl.
 CPC .......... *H03K 17/687* (2013.01); *Y02D 10/152* (2018.01); *Y02D 10/171* (2018.01)

(56) References Cited

U.S. PATENT DOCUMENTS

| | | | |
|---|---|---|---|
| 5,955,870 | A | 9/1999 | Nair |
| 6,636,023 | B1 | 10/2003 | Amin |
| 7,112,978 | B1 | 9/2006 | Koniaris et al. |
| 7,190,210 | B2 | 3/2007 | Azrai et al. |
| 7,454,643 | B2 | 11/2008 | He |
| 7,498,835 | B1 | 3/2009 | Rahman et al. |
| 7,498,836 | B1 | 3/2009 | Tuan |
| 7,518,355 | B2* | 4/2009 | Grassi ................ G06F 1/26 324/757.04 |
| 7,525,373 | B1 | 4/2009 | Ogilvie |
| 7,598,630 | B2* | 10/2009 | Burton ............... G06F 1/3203 307/140 |
| 7,759,916 | B2 | 7/2010 | Kleveland |
| 8,564,262 | B2 | 10/2013 | Bose et al. |
| 2001/0052800 | A1 | 12/2001 | Mizuno et al. |
| 2002/0108065 | A1 | 8/2002 | Mares |
| 2002/0138778 | A1 | 9/2002 | Cole et al. |
| 2006/0033551 | A1 | 2/2006 | Dong et al. |
| 2006/0224337 | A1 | 10/2006 | Hazucha et al. |
| 2007/0018622 | A1 | 1/2007 | Chen |
| 2007/0164806 | A1 | 7/2007 | Gasper et al. |
| 2007/0234078 | A1 | 10/2007 | Nguyen et al. |
| 2008/0082876 | A1 | 4/2008 | Yu et al. |
| 2008/0168287 | A1 | 7/2008 | Berry et al. |
| 2008/0238407 | A1 | 10/2008 | Grassi et al. |
| 2008/0256376 | A1* | 10/2008 | You .................. G06F 1/3203 713/324 |
| 2008/0284504 | A1 | 11/2008 | Hirota et al. |
| 2009/0085552 | A1* | 4/2009 | Franza .................. G06F 1/26 323/350 |
| 2009/0085607 | A1* | 4/2009 | Zelikson ............ H01L 27/0222 326/83 |
| 2009/0146734 | A1 | 6/2009 | Fallah et al. |
| 2009/0230934 | A1 | 9/2009 | Hoojischuur et al. |
| 2009/0322304 | A1 | 12/2009 | Oraw et al. |
| 2010/0033151 | A1 | 2/2010 | Wu et al. |
| 2010/0072961 | A1 | 3/2010 | Kosonocky et al. |
| 2010/0292856 | A1 | 11/2010 | Fujita |
| 2011/0047397 | A1 | 2/2011 | Lee |
| 2011/0188218 | A1 | 8/2011 | Hsing et al. |
| 2013/0021091 | A1* | 1/2013 | Robertson ........... G06F 1/3203 327/540 |
| 2014/0159681 | A1 | 6/2014 | Oraw et al. |
| 2014/0359333 | A1 | 12/2014 | Nguyen |

FOREIGN PATENT DOCUMENTS

| | | | |
|---|---|---|---|
| KR | 100785150 | B2 | 12/2007 |
| KR | 20080014531 | | 2/2008 |
| KR | 20090077952 | | 7/2009 |
| WO | 2007149517 | A2 | 12/2007 |
| WO | 2007149517 | | 9/2008 |
| WO | 2013101718 | A1 | 12/2012 |
| WO | 2013100890 | A1 | 7/2013 |

OTHER PUBLICATIONS

Extended European Search Report for EP Patent Application No. 11878840.5, dated Jun. 22, 2015.
English Translation of Notice of Preliminary Rejection for Korean Patent Application No. 10-2014-7015521, dated Feb. 25, 2016.
Office Action for European Patent Application No. 11878840.5, dated Mar. 1, 2016.
Taiwan Office Action dated Feb. 2, 2015 for Taiwan Patent Application No. 101149598.
International Preliminary Report on Patentability and Written Opinion received for PCT Patent Application No. PCT/US2011/067334, dated Jul. 10, 2014, 6 pages.
International Preliminary Report on Patentability and Written Opinion received for PCT Patent Application No. PCT/US2012/071181, dated Jul. 10, 2014, 6 pages.
Notice of Grant received for Chinese Patent Application No. 201220734566.3, dated Aug. 29, 2013, 1 page of English Translation and 2 pages of Notice of Grant.
Notice of Grant received for Chinese Patent Application No. 201220734910.9, dated Jan. 14, 2014, 1 page of English Translation and 2 pages of Notice of Grant.
Office Action Received for Chinese Patent Application No. 201220734566.3, dated May 7, 2013.
Office Action Received for Chinese Patent Application No. 201220734910.9 dated Apr. 25, 2013.
Office Action Received for Chinese Patent Application No. 201220734910.9, dated Aug. 19, 2013.
Freescale's Leading-Edge PMIC Solution. Analog, Mixed Signal and power Management Designed for the Intel Atom Z6xx mobile platform.
DC-DC Conversion Without InductorsAPP 725: Jul. 22, 2009 Tutorial 725, An725, AN 725, APP725, Appnote 725, Appnote 725.
International Search Report and Written Opinion received for Patent Application No. PCT/US2011/067334, dated Sep. 3, 2012.
International Search Report and Written Opinion received for PCT Patent Application No. PCT/US2012/071181, dated Feb. 28, 2013.
Rao, Arun. An Efficient Switched Capacitor Buck-Boostvoltage Regulator Using Delta-Sigma Control Loop. A Thesis submitted to Oregon State University in partial fulfillment of the requirements for the degree of Master of Science.
Seeman, Michael D. A Design Methodology for Switched-Capacitor DC-DC Converters. Electrical Enginering and Computer Sciences University of California at Berkely.
Wikipedia. Low-dropout regulator.
Wikipedia. PID controller.
Wikipedia. Voltage regulator.
Final Office Action from U.S. Appl. No. 13/976,156 dated May 6, 2016, 13 pgs.
Final Office Action from U.S. Appl. No. 13/976,156 dated May 19, 2017, 14 pgs.
Final Office Action from U.S. Appl. No. 13/976,156 dated Apr. 10, 2015, 10 pgs.
First Office Action from Chinese Patent Application No. 201180073372.1 dated Feb. 26, 2016, 22 pgs.
International Preliminary Report on Patentability from PCT/US2011/053144 dated Apr. 3, 2014, 7 pgs.
International Search Report and Written Opinion from PCT/US2011/053144 dated Apr. 26, 2012, 8 pgs.
Non-Final Office Action from U.S. Appl. No. 13/976,156 dated Aug. 13, 2014, 9 pgs.
Non-Final Office Action from U.S. Appl. No. 13/976,156 dated Sep. 11, 2015, 11 pgs.
Non-Final Office Action from U.S. Appl. No. 13/976,156 dated Sep. 15, 2016, 11 pgs.
Non-Final Office Action from U.S. Appl. No. 14/129,593 dated Apr. 4, 2016, 30 pgs.
Notice of Allowance from U.S. Appl. No. 13/976,156 dated Jan. 12, 2018, 7 pgs.
Notice of Allowance from U.S. Appl. No. 14/129,593 dated Jan. 4, 2017, 16 pgs.
Notification to Grant Patent from Chinese Patent Application No. 201180073372.1 dated May 3, 2017, 2 pgs.
Second Office Action from Chinese Patent Application No. 201180073372.1 dated Oct. 20, 2016, 10 pgs.
Supplementary European Search Report from European Patent Application No. 12863334.4 dated Aug. 7, 2015, 6 pgs.
Office Action and Search Report dated Feb. 12, 2015 for Taiwan Patent Application No. 101149598.

(56) References Cited

OTHER PUBLICATIONS

Summons to attend Oral Proceedings dated Sep. 13, 2018 for EP Patent Application No. 11878840.5.

* cited by examiner

METHODS AND SYSTEMS TO CONTROL POWER GATES DURING AN ACTIVE STATE OF A GATED DOMAIN BASED ON LOAD CONDITIONS OF THE GATED DOMAIN

BACKGROUND

An integrated circuit die may include one or more gated power domains for which power may be selectively applied and disrupted, referred to as power gating. Conventionally, power gating is used to intermittently disable or deactivate an entire gated power domain to conserve power when circuitry of the gated power domain is not needed. This may be referred to as placing the gated power domain in a sleep mode or state.

Power gates present an inherent resistance between a power supply and a gated power distribution grid (gated grid). A gated grid voltage may differ from a power supply voltage based on the resistance of the power gates and current consumption of the corresponding gated power domain, in accordance with Ohm's law.

The power supply voltage may be set based on anticipated load conditions. Out of caution, maximum load conditions or maximum current consumption may be assumed. During operation, however, a gated power domain may draw less current from the gated grid than anticipated, and/or the current draw may vary over time.

When the gated power domain draws less current than anticipated, the voltage drop over the corresponding power gates is less than anticipated. As a result, the gated grid voltage may be higher than a target gated voltage. The higher gated voltage may not necessarily improve performance of the gated power domain, and may decrease power efficiency through leakage and/or active power dissipation.

BRIEF DESCRIPTION OF THE DRAWINGS/FIGURES

Figure 1:
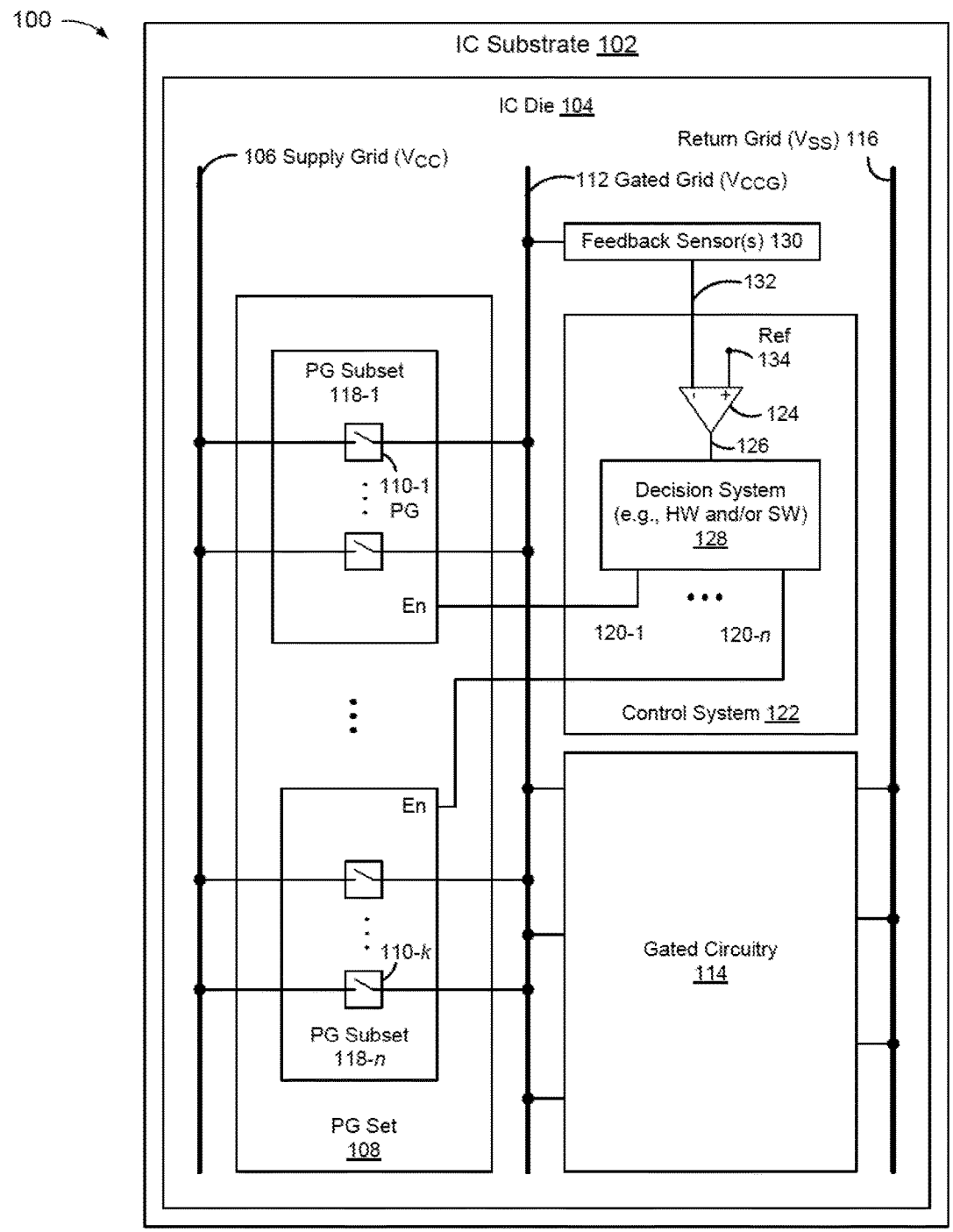
FIG. 1 is a block diagram of an integrated circuit (IC) system, including a control system to selectively enable and disable subsets of power gates during an active state of a gated power domain based on sensed feedback.

In the drawings, the leftmost digit(s) of a reference number identifies the drawing in which the reference number first appears.

DETAILED DESCRIPTION

Disclosed herein are methods and systems to selectively enable and disable individual subsets of power gates during an active state of a gated power domain based on a load condition of the gated power domain.

Also disclosed herein are methods and systems to adjust an effective resistance between a supply voltage and a gated power domain voltage in response to changes in current consumption within the gated power domain.

Disclosed herein are methods and systems to maintain an operating voltage of the gated power domain substantially equal to a target voltage.

Methods and systems disclosed herein may be implemented to manage short-term excess voltage at transistors gates in real-time, such as to provide real-time gate voltage regulation during an operational or P state of a gated power domain.

FIG. 1 is a block diagram of an integrated circuit (IC) system 100 to selectively enable and disable subsets of power gates of a gated power domain.

IC system 100 includes an IC die 104, which may be affixed or mounted to a substrate 102.

IC die 104 may include a power supply distribution network or grid (supply grid) 106 to receive electrical power from substrate 102, denoted here as a supply voltage $V_{CC}$. $V_{CC}$ may be regulated by an on-die or off-die power management system. $V_{CC}$ may correspond to an ungated supply.

IC die 104 further includes power gates (PGs) 110-1 through 110-$k$ to couple source grid 106 to a gated power distribution network or grid (gated grid) 112. A totality of all power gates associated with gated grid 112 may be referred to herein as a set, illustrated in FIG. 1 as a PG set 108.

PGs 110 may be implemented in one or more clusters or strips, and/or may be distributed amongst circuitry of IC die 104 and/or distributed within one or more layers or levels of IC die 104. PGs 110 may be implemented as described below with reference to one or more of FIGS. 2-8. PGs 110 are not, however, limited to the examples herein.

Gated grid 112 may provide electrical power to circuitry 114, illustrated here as a gated $V_{CC}$, or $V_{CCG}$. Gated grid 112 and circuit 114 may be referred to as a gated power domain, and circuitry 114 may be referred to as gated power domain circuitry or gated circuitry.

IC die 104 may further include a power supply return network or grid (return grid) 116, to provide a reference to $V_{CC}$ and $V_{CCG}$, illustrated here as $V_{SS}$. $V_{CC}$ and $V_{CCG}$ may correspond to positive voltages and $V_{SS}$ may correspond to 0 volts or ground. Methods and system disclosed herein are not, however, limited to these examples.

IC die 104 may further include a set of power gates to couple return grid 116 to a gated return grid.

IC die 104 may include one or more additional sets of power gates and corresponding gated power distribution grids to provide one or more additional gated power domains, such as described below with reference to FIG. 10.

PG set 108 may be controllable to disconnect gated grid 112 from supply grid 106, such as to place circuitry 114 in an inactive or sleep state.

Subsets of power gates 110, illustrated here as PG subsets 118, may be individually controllable to couple supply grid 106 to gated grid 112 during an active or operational state of circuitry 114.

In FIG. 1, system 100 includes a control system 122 to selectively enable and disable individual subsets of power gates (PG subsets) 118-1 through 118-$n$, with corresponding enable controls 120-1 through 120-$n$.

Control system 122 may be implemented to control PG subsets 118 to maintain $V_{CCG}$ at a target operating voltage over variations in load, or current draw of circuitry 114.

For example, when the current drawn by circuitry 114 decreases, the voltage drop across PG set 108 is reduced. As a result, $V_{CCG}$ may be higher than a target voltage. In this situation, control system 122 may reduce the number of enabled PG subsets 118 to increase the resistance presented by PG set 108. This increases the voltage drop across PG set 108 to maintain $V_{CCG}$ at the target level.

Conversely, when the current drawn by circuitry 114 increases, control system 122 may increase the number of enabled PG subsets 118 to decrease the resistance presented by PG set 108. This reduces the voltage drop across PG set 108 to maintain $V_{CCG}$ at the target value.

The resistance of PG set 108 may be expressed as:

$$R_{PG\_Set} = \frac{V_{CC} - V_{Target}}{(I_{leak}(T, V_{Target}) + I_{dyn}^{real}(V_{Target}, f))}$$

Control system 122 may thus be implemented to dynamically compensate for differences between an anticipated current consumption (e.g., a maximum current consumption), and a real-time or instantaneous current consumption. Dynamic control of PG subsets 118 may help to maintain a consistent overall IR droop of circuitry 114.

When less than all of PGs 110 are enabled during an operating state of circuitry 114, control system 122 may return PG set 108 to a highest conduction state (i.e., all PG subsets 118 enabled), substantially instantaneously, without risk of charge-sharing-based negative supply voltage transients, since $V_{CCG}$ is already at the target level. A return to the highest conduction state may be performed within, for example, one clock cycle, and may be synchronized with one or more global or system clock gating signals.

In FIG. 1, system 100 may include one or more sensors 130 to sense a load condition of circuitry 114 and provide a corresponding sensed feedback 132. A sensor 130 may include a voltage sensor to sense $V_{CCG}$. A sensor 130 may be located physically proximate to gated grid 112 and/or proximate to a transistor gate within circuitry 114. Multiple feedback sensors 130, when implemented, may be distributed within one or more layers or levels of IC die 104, including amongst circuitry 114.

Control system 122 may include a comparator 124 to compare sensed feedback 132 to a reference value 134, which may represent a target value of $V_{CCG}$. Example reference values 134 are described below with reference to FIG. 6

Control system 122 further includes a decision system 128 to selectively configure enable controls 120 based on comparison results 126 from comparator 124.

Where PG subsets 118 are distributed, decision system 128 may be implemented to selectively enable and disable PG subsets 118 based in part on locations of the PG subsets. In other words, control system 122 may be implemented to distribute resistance or conductance of PG set 108 within one or more layers of IC die 104.

Control system 122 may be implemented within IC die 104, as illustrated in FIG. 1. Alternatively, control system 122 or portions thereof may be implemented off-die and/or external to system 100.

Control system 122 may be implemented in hardware, software, and combinations thereof, such as described further below with reference to FIG. 6.

One or more power gates 110 may be implemented in accordance with one or more conventional power gate configurations, and may be fabricated within one or more layers associated with circuitry 114.

Figure 2:
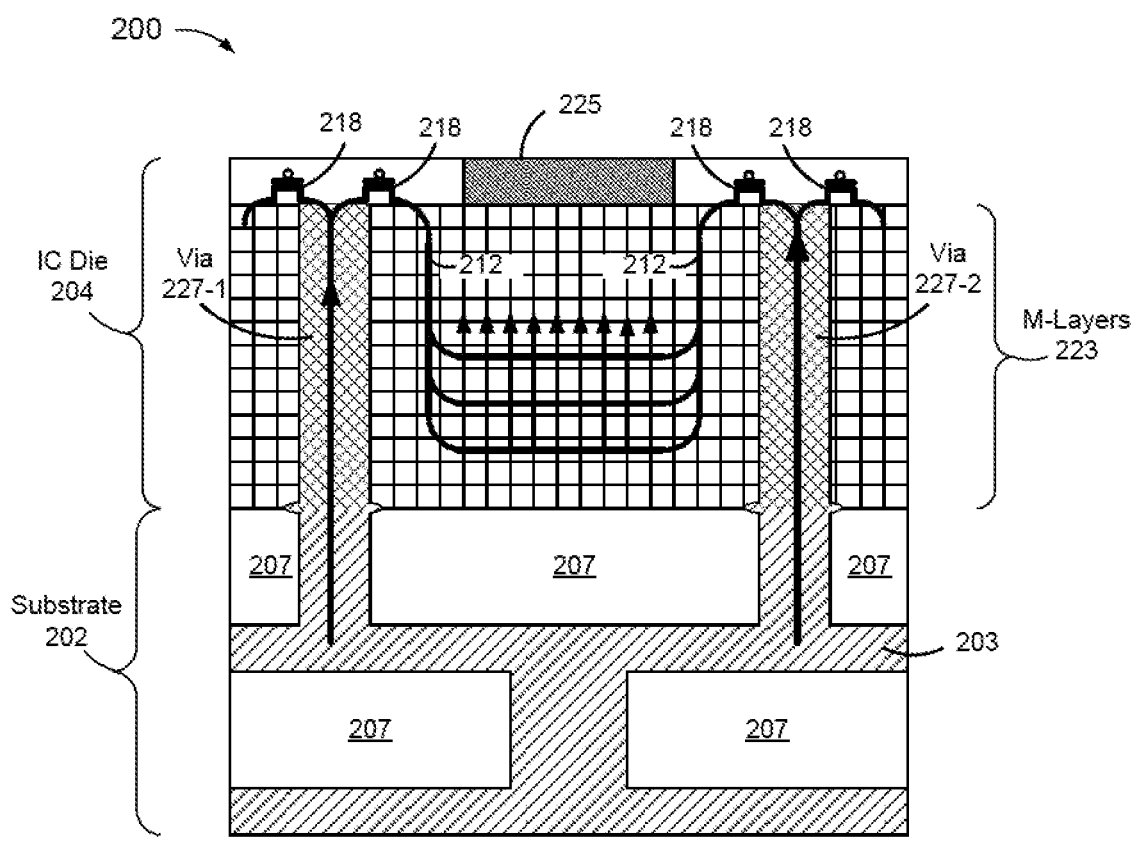
FIG. 2 is a cross-sectional block diagram of a portion of an IC system, including a substrate and an IC die.

FIG. 2 is a cross-sectional block diagram of a portion of an IC system 200, including a substrate 202 and an IC die 204.

Substrate 202 may include electrically conductive material 203 to provide a supply or un-gated voltage, $V_{CC}$, to IC die 204 through vias 227. Substrate 202 may include additional electrically conductive material to provide a supply return, or $V_{SS}$. Substrate 202 may further include structurally supportive material 207.

IC die 204 may include an un-gated power distribution grid within metal layers 223 to distribute $V_{CC}$.

IC die 204 may include multiple subsets of power gates (PG subsets), 218 to couple supply voltage $V_{CC}$ from the vias 218 and/or from the un-gated power distribution grid to a gated grid 212. Clusters or strips of power gates 218 may be distributed throughout circuitry 225.

Gated grid 212 may be implemented within one or more metal layers 223, such as described below with reference to FIG. 3.

Figure 3:
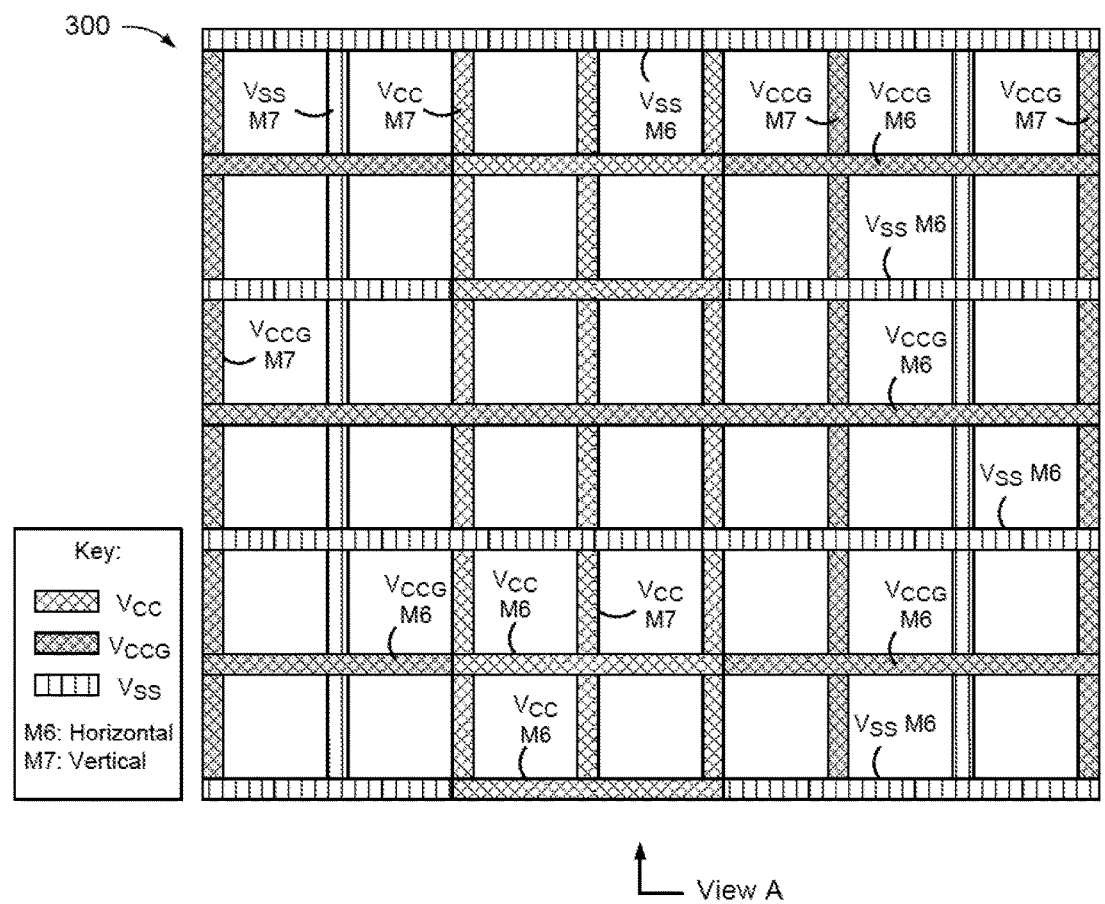
FIG. 3 is a downwardly-directed view of a portion of a power distribution system of an IC die.

FIG. 3 is an illustration of a portion of a power distribution system 300, directed toward a surface of a metal layer of an IC die, denoted here as M6.

FIG. 3 includes grid elements within metal M6, and grid elements within a lower layer denoted here as M7. Grid elements within layer M6 are depicted horizontally, and grid elements within layer M7 are depicted vertically. The horizontal and vertical depictions are for illustrative purposes only. Methods and systems disclosed herein are not limited to the example of FIG. 3.

Figure 4:
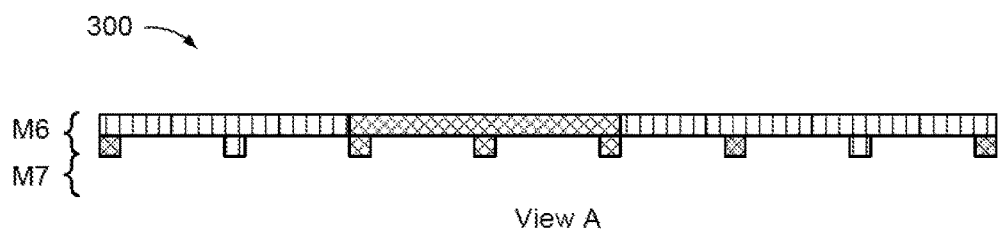
FIG. 4 is a cross-sectional side-view of the power distribution system illustrated in FIG. 3.

FIG. 4 is a cross-sectional block diagram of power distribution system 300.

In the examples of FIGS. 3 and 4, layers M6 and M7 each include elements of a supply grid, a gated grid, and a return grid, illustrated here as $V_{CC}$, $V_{CCG}$, and $V_{SS}$, respectively. Elements of the supply grid, the gated grid, and/or the return grid may be also implemented in other metal layers of the IC die.

In FIG. 1, PGs 118-1 through 118-$k$ may be substantially similar to one another. Alternatively, PG set 108 may include multiple types of power gates 110.

A power gate 110 may include one or more power devices, which may include a P-type device, such as a PMOS transistor, and/or an N-type device, such as an NMOS transistor. Where power gate 110 includes a power transistor, a gate of the transistor may be controlled by a corresponding one of enable controls 120. The enable control may be applied to the transistor gate, directly or indirectly through control circuitry such as described below with respect to one or more of FIGS. 5 through 8.

Figure 5:
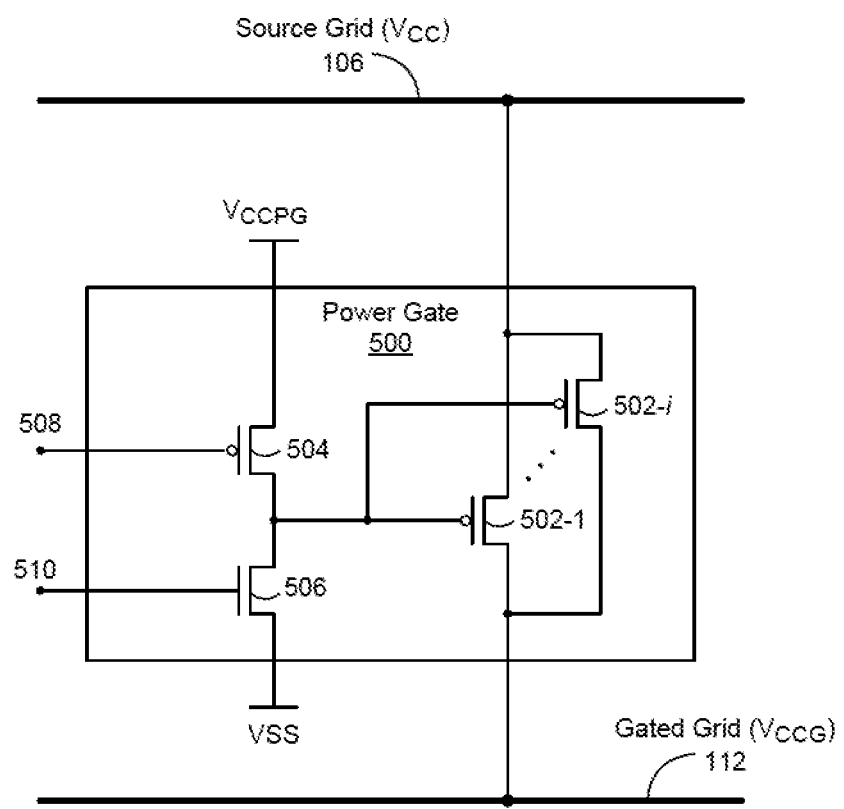
FIG. 5 is a circuit diagram of a power gate and a portion of control logic.

FIG. 5 is a circuit diagram of a power gate 500, including one or more power devices 502 to couple a source grid 506 to a gated grid 512, such as taught in U.S. Pat. No. 7,880,284.

In FIG. 5, power devices 502 are illustrated as PMOS devices. Power devices 502 are not, however, limited to PMOS devices.

Power gate 500 includes enable control circuitry, illustrated here as including a P-type device 504 and an N-type device 506, each to receive a corresponding one of controls 508 and 510. Controls 508 and 510 may correspond to one of enable controls 120 in FIG. 1

When controls 508 and 510 are high, $V_{SS}$ is asserted at gates of power devices 502 via P-type device 506. This turns on power devices 502, which coupled source grid 106 to gated grid 112 via power devices 502. This also effectively decreases the resistance of PG set 108 in FIG. 1.

Conversely, when controls 508 and 510 are low, $V_{CCPG}$ is asserted at the gates of power devices 502 via N-type device 504. This turns off power devices 502, which precludes charge from flowing through power devices 502. This also effectively increases the resistance of PG set 108. $V_{CCPG}$ may correspond to $V_{CC}$, $V_{CCG}$, or another un-gated or gated voltage.

Figure 6:
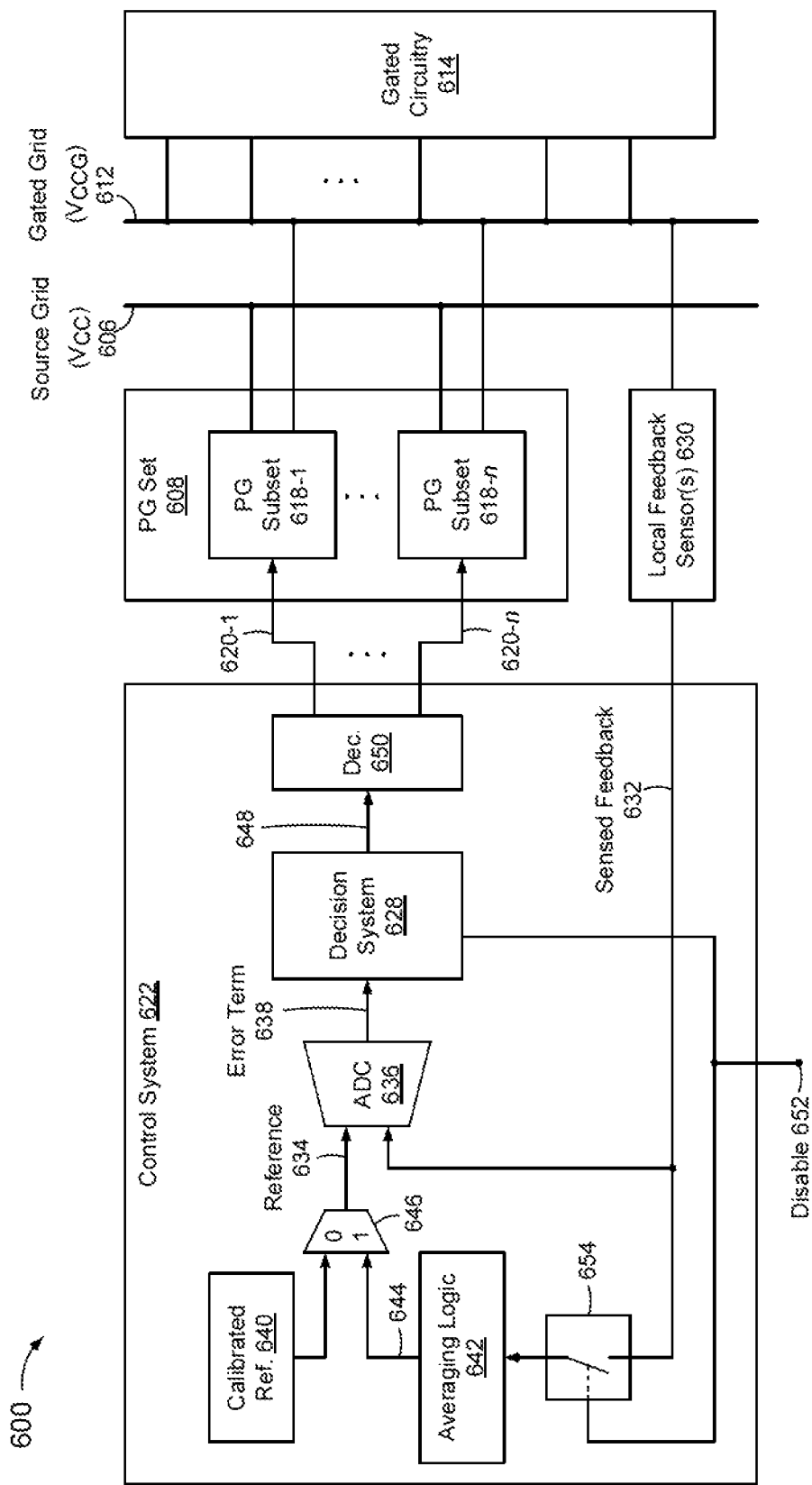
FIG. 6 is a block diagram of another control system to selectively enable and disable subsets of power gates during an active state of a gated power domain based on sensed feedback.

FIG. 6 is a block diagram of an IC system 600, including a control system 622 to selectively enable and disable subsets of power gates 618 of a PG set 608 based on sensed feedback 632 from one or more sensors 630, such as described above with reference to FIG. 1.

Control system 622 may include an analog-to-digital converter (ADC) 636 to output a digital error term 638 indicative of a difference between sensed feedback 632 and a reference 634.

Reference 634 may represent a target voltage for gated grid 612, which may include a pre-determined target value, and which may include a calibrated reference value 640.

Alternatively, or additionally, control system 622 may include averaging logic 642 to provide reference value 634 as a moving average 644 of sensed feedback 632. Moving average 644 may be computed over a pre-determined number of clock cycles.

Control system 622 may include multiplexer logic 646 to selectively provide one of calibrated reference 640 and moving average 644 as reference 634.

Control system 622 may include a decision system 628 to selectively enable and disable individual ones of PG subsets 618 based on error term 638. Decision system 628 may be implemented to control PG subsets 608 to minimize error term 638. Decision system 628 may be further implemented to control PG subsets 608 based in part on a present configuration of enable controls 620 and/or one or more preceding states.

Decision system 628 may be implemented in hardware, software, and combinations thereof. A hardware implementation may include, without limitation, logic gates, combinational logic, registers, flip-flops, and/or an instruction processor/controller. A software implementation may include a computer readable medium encoded with a computer program including instructions to be executed by an instruction processor. The computer readable medium may include a transitory and/or non-transitory medium.

Decision system 628 may be implemented to operate as a finite state machine (FSM), which may be implemented to control PG subsets 618 based on successive approximation. A hardware-based FSM may include a programmable logic device or controller, a register to store state variables, and combinational logic to determine state transitions, and combinational logic to generate outputs.

A software-based decision system 628 may include code morphing software (CMS), such as used within binary translation based machines. CMS may be executed on a processor fabricated within a corresponding IC die, such as in circuitry 225 of FIG. 2. Alternatively, decision system 628 may include a dedicated processor, such as a controller, to execute the CMS. The CMS may be encoded within firmware of the IC die, and may be copied to memory at run-time.

Decision system 628 may be implemented to output enable controls 620-1 through 620-n to respective ones of PG subsets 618-1 through 618-n. Alternatively, decision system 628 may be implemented to output a digital control or digital word 648, and control system 622 may include a decoder 650 to decode enable controls 620-1 through 620-n from digital control 648.

Control system 622 may be implemented to maintain $V_{CCG}$ substantially equal to a target value, as sensed at gated grid 612 and/or as sensed at transistor gates within gated circuitry 614.

Control system 622 may be implemented to selectively enable and disable PG subsets 618 based in part on physical locations of the PG subsets, such as described in one or more examples herein.

Control system 622 may be controllable to disable all power gates within PG set 608, such as to place gated circuitry 614 in an inactive or sleep state, which may be based on a disable control 652. Control system 622 may further include a switch 654 to disable averaging logic 642 in response to disable command 652.

A control system, such as control system 122 in FIG. 1 and/or control system 621 in FIG. 6, may be implemented to operate on a system clock and/or other clock gating signals of a corresponding IC die.

A control system, such as control system 122 in FIG. 1 and/or control system 621 in FIG. 6, may be implemented to under control of power management software or power distribution unit (PDU).

An IC system, such as described above with reference to one or more of FIGS. 1-9 may be implemented within a wide variety of devices, an example of which is described below with reference to FIG. 10.

Figure 7:
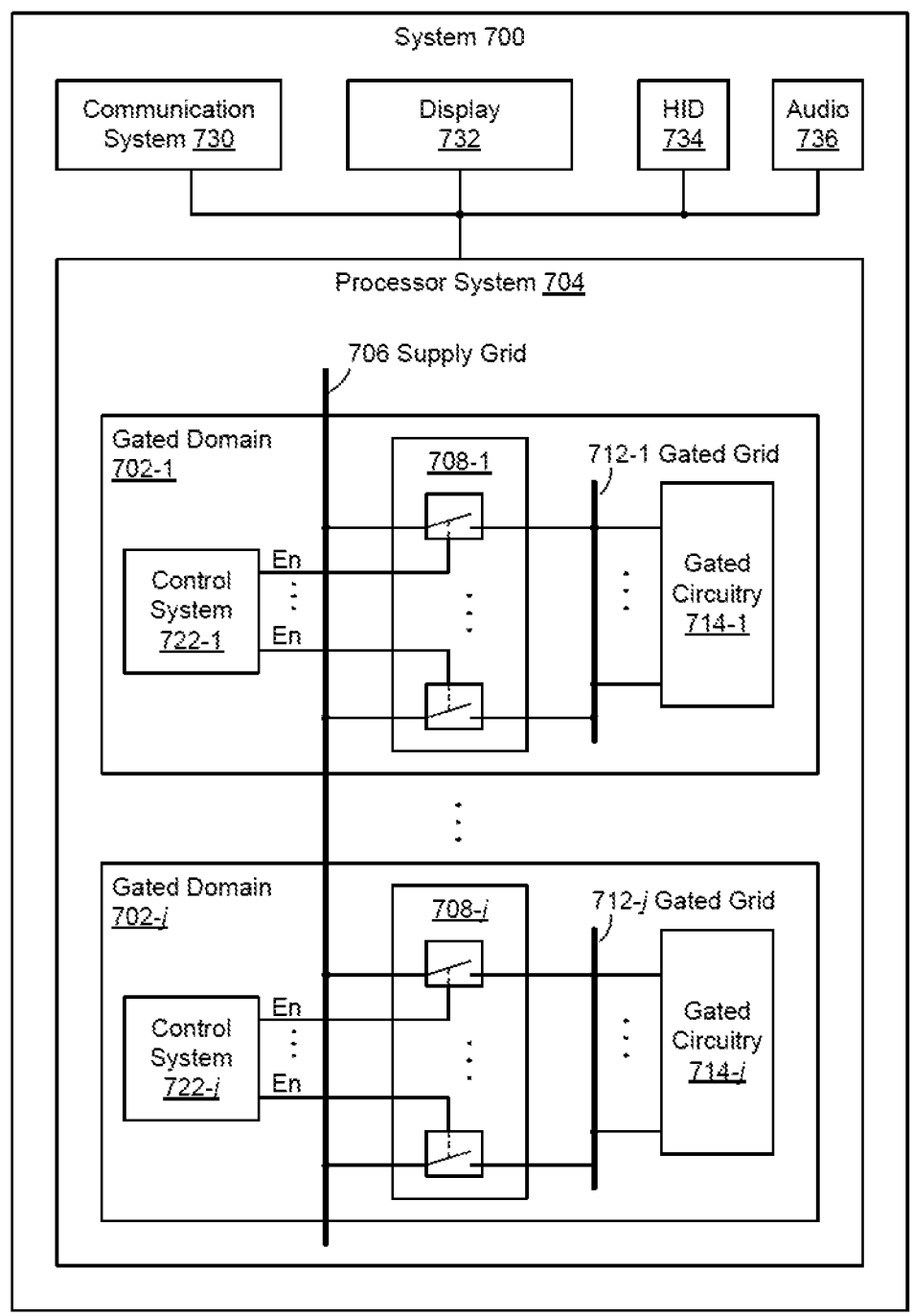
FIG. 7 is a block diagram of a processor system having multiple gated power domains.

FIG. 7 is a block diagram of a system 700, including a processor system 704 having multiple gated power domains (domains) 702-1 through 702-j. Processor system 704 may include one or more processors, processor cores, IC dies, circuit boards, and/or physical devices.

Each domain 702 includes gated circuitry 714, a gated power distribution grid (gated grid) 712, and a set of power gates (PG sets) 708 to couple a supply grid 706 to the corresponding gated grid 712. Each domain 702 further includes a control system 722 to selectively enable and disable subsets of the corresponding PG set 708, such as described in one or more examples above.

One or more of control system 722 may be implemented to disable all power gates of the corresponding PG set 708, such as to place the corresponding gated circuitry 714 in an inactive or sleep state. The control system(s) 722 may be further implemented to re-enable subsets of the power gates to return the corresponding gated circuitry 714 to an active state, such as described in one or more examples above.

System 700 may further include a communication system 730 to interface between processor system 704 and a communication network. Communication system 730 may include a wired and/or wireless communication system.

System 700 may further include a monitor or display 732 to present information from one or more of processor system 704 and communication system 730.

System 700 may further include a human interface device (HID) 734 to provide user input to one or more of processor system 704 and communication system 730. HID 734 may include, for example and without limitation, one or more of a key board, a cursor device, a touch-sensitive device, and or a motion and/or image sensor. HID 734 may include a physical device and/or a virtual device, such as a monitor-displayed or virtual keyboard.

System 700 may further include an audio system 736 to provide an audible output from processor system 704 and/or communication system 730.

System 700 may include a housing to receive processor system 704, communication system 730, display 732, HID 734, and/or an interface thereto.

The housing may include, without limitation, a rack-mountable housing, a desk-top housing, a lap-top housing, a notebook housing, a net-book housing, a set-top box housing, a hand-held housing, and/or other conventional electronic housing and/or future-developed housing.

System 700 may correspond to, without limitation, a computer system, a server system, and/or a hand-held processor and/or communication device.

System 700 may further include a battery system to supply power to supply grid 706.

Figure 8:
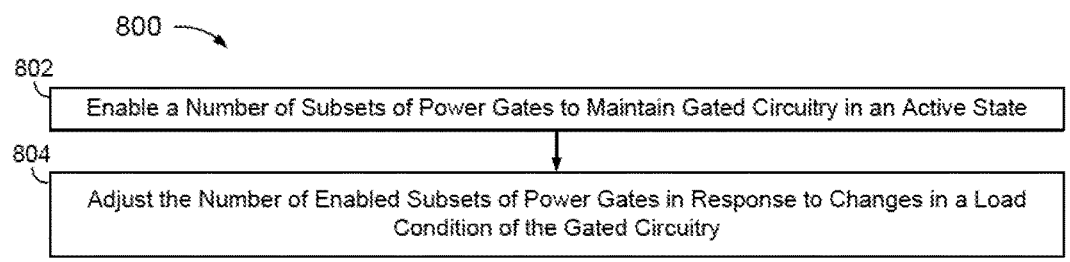
FIG. 8 is a flowchart of a method of controlling power gates during an active state of a gated power domain.

FIG. 8 is a flowchart of a method 800 of dynamically controlling power gates during an active state of corresponding gated circuitry. Method 800 may be implemented a system such as described above with reference to one or more of FIGS. 1-7. Method 800 is not, however, limited to any of FIGS. 1-7.

At 802, a number of subsets of power gates are enabled to couple a power supply grid to a gated power distribution grid (gated grid) of an integrated circuit die, to maintain the gated circuitry in an active state. The power gates may be implemented as described in one or more examples above.

At 804, the number of enabled subsets of power gates is adjusted in response to changes in a load condition of the gated circuitry, such as described in one or more examples herein and/or as described below with reference to FIG. 9.

Figure 9:
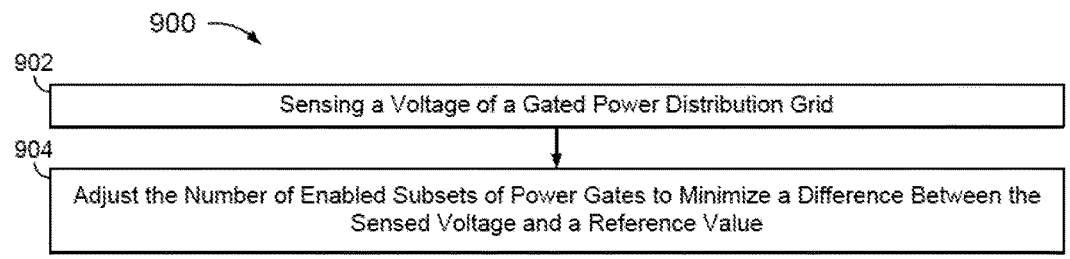
FIG. 9 is a flowchart of a method of adjusting a number of enabled power gates during an active state of a gated power domain.

FIG. 9 is a flowchart of a method 900 of dynamically adjusting a number of enabled power gates during an active state of gated circuitry.

At 902, a voltage of a gated power distribution grid is sensed or monitored.

At 904, a number of enabled subsets of power gates is adjusted to minimize a difference between the sensed the sensed voltage and a reference value. The reference value may correspond to one or more of a pre-determined value, a calibrated value, and a moving average of the sensed voltage. The reference value may be selectable from amongst multiple reference values.

Where the power gates are distributed within one or more layers of an IC, the adjusting at 804 and/or 904 may include selectively enabling and/or disabling one or more of the subsets of power gates based on locations of the corresponding power gates.

Method 800 and/or method 900 may further include disabling all power gates associated of the gated power domain, such as to place the gated circuitry in an inactive state, such as described below with reference to FIG. 10.

Figure 10:
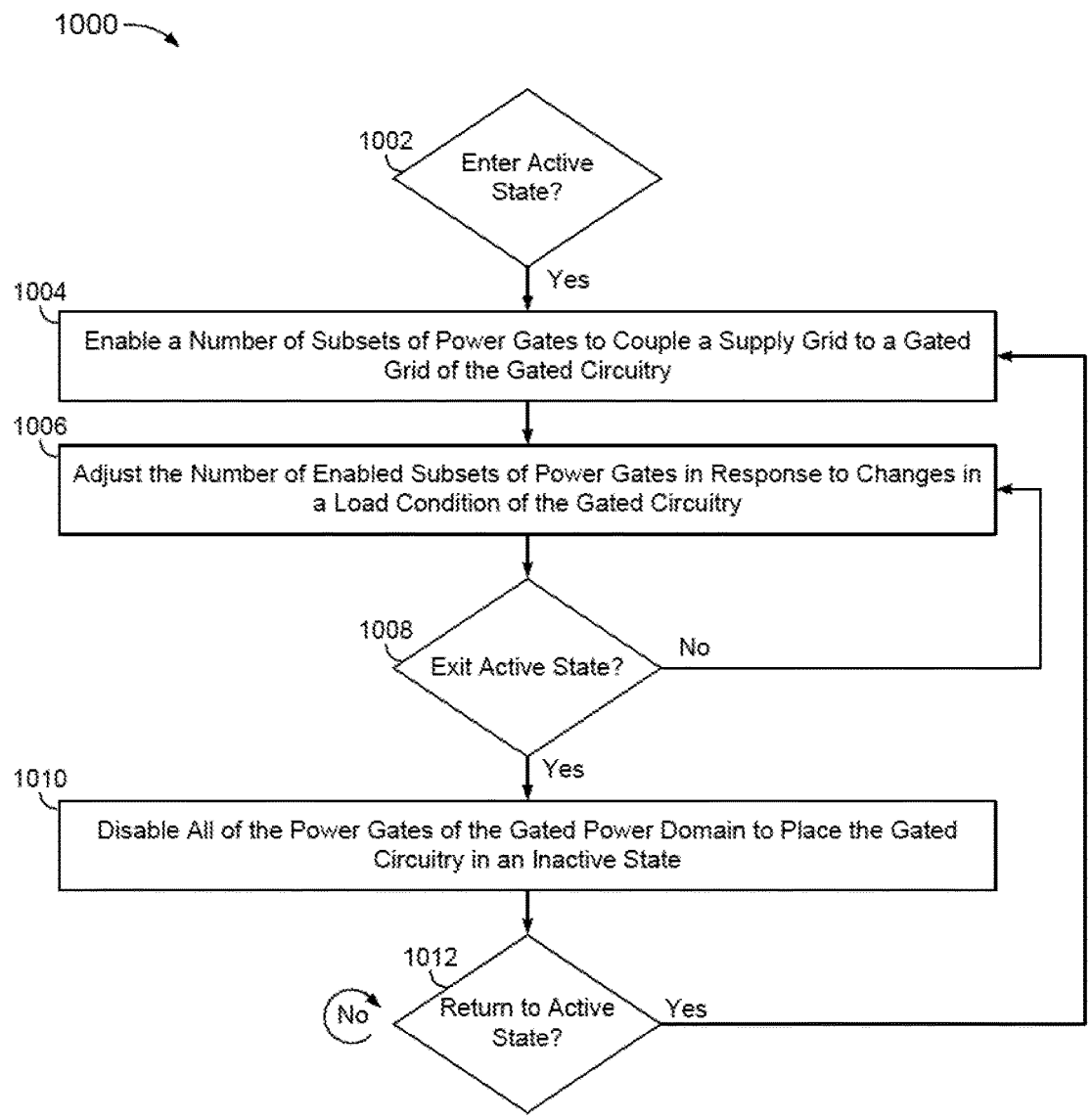
FIG. 10 is a flowchart of a method of adjusting a number of enabled power gates during an active state of a gated power domain, and intermittently disabling all of the power gates to place the gated power domain in an inactive state.

FIG. 10 is a flowchart of a method 1000 of dynamically adjusting a number of enabled power gates during an active state of a corresponding gated power domain, and intermittently disabling all of the power gates to place the domain in an inactive state.

At 1002, when the gated power domain is to be in an active state, processing proceeds to 1004, where a number of subsets of power gates are enabled, such as described above with reference to 802.

At 1006, the number of enabled subsets of power gates may be adjusted, such as described above with reference to 804 and/or 904.

At 1008, when the gated circuitry is to be deactivated, or placed in an inactive or sleep state, processing proceeds to 1010, where all of the power gates of the gated power domain are disabled.

At 1010, when the gated power domain is to return to the active state, processing returns to 1004 to re-enable a number of the subsets of power gates.

Methods and systems disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, a combination of integrated circuit packages, and/or a system-on-a-chip (SoC).

Devices may be described herein as one or more of a P-type or PMOS device and an N-type or NMOS device. A P-type device and/or a PMOS device may include a P-type metal oxide semiconductor field effect transistor. An N-type device and/or a NMOS device may include an N-type metal oxide semiconductor field effect transistor. Unless specified otherwise herein, methods and systems disclosed herein are not limited to such devices, and may be implemented with one or more other suitable conventional devices and/or future-developed devices.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the examples provided herein.

What is claimed is:

1. An apparatus, comprising:
    a supply grid;
    a gated grid;
    a first power gate which is operable to couple the supply grid to the gated grid;
    a second power gate which is operable to couple the supply grid to the gated grid;
    a load to receive power from the gated grid; and
    a control system to selectively enable or disable the first and second power gates according to active operation mode of the load.

2. The apparatus of claim 1, wherein the control system comprises:
    a feedback mechanism coupled to the gated grid, wherein the feedback mechanism is to provide a first output.

3. The apparatus of claim 2, wherein the control system comprises:
    an amplifier to receive the first output and to compare the first output with a reference signal, wherein the amplifier is to provide a second output.

4. The apparatus of claim 3, wherein the second output is coupled to the first and second power gates.

5. The apparatus of claim 3, wherein the second output is to directly or indirectly cause the selectively enabling or disabling of the first and second power gates.

6. The apparatus of claim 3, wherein the reference signal is a reference voltage.

7. The apparatus of claim 1, wherein the first and second power gates include p-type devices.

8. The apparatus of claim 1, wherein the supply grid is coupled to an input power supply.

9. The apparatus of claim 1, wherein the control system includes logic to adjust a number of active subsets of power gates according to code morphing instructions.

10. The apparatus of claim 1, wherein the control system is to selectively enable and disable subsets of power gates based in part on locations of the subsets.

11. A system comprising:
an integrated circuit (IC) including:
a supply grid;
a gated grid;
a first power gate which is operable to couple the supply grid to the gated grid;
a second power gate which is operable to couple the supply grid to the gated grid;
a load to receive power from the gated grid; and
a control system to selectively enable or disable the first and second power gates according to active operation mode of the load;
a communication system coupled to the IC; and
a user interface coupled to the communication system.

12. The system of claim 11, wherein the control system comprises:
a feedback mechanism coupled to the gated grid, wherein the feedback mechanism is to provide a first output; and
an amplifier to receive the first output and to compare the first output with a reference signal, wherein the amplifier is to provide a second output.

13. The system of claim 12, wherein the second output is coupled to the first and second power gates.

14. The system of claim 12, wherein the second output is to directly or indirectly cause the selectively enabling or disabling of the first and second power gates.

15. The system of claim 12, wherein the reference signal is a reference voltage.

16. The system of claim 11, wherein the first and second power gates include p-type devices.

17. The system of claim 11, wherein the supply grid is coupled to an input power supply.

18. The system of claim 11, wherein the control system includes logic to adjust a number of active subsets of power gates according to code morphing instructions.

19. A processor system comprising:
a supply grid;
a first processor having a first gated grid and a first of power gate coupled to the first gated grid and the supply grid;
a second processor having a second gated grid and a second power gate coupled to the second gated grid and the supply grid; and
a control system to selectively enable or disable first and second power gates of the first and second processors, respectively, such that the processor system remains active.

20. The processor system of claim 19, wherein the control system comprises:
a feedback mechanism coupled to the first gated grid, wherein the feedback mechanism is to provide a first output; and
an amplifier to receive the first output and to compare the first output with a reference signal, wherein the amplifier is to provide a second output.

21. An apparatus, comprising:
a first power gate which is operable to couple a supply grid to a gated grid;
a second power gate which is operable to couple the supply grid to the gated grid, wherein the gated grid is to couple a load which is to receive power through the gated grid; and
a control system to selectively enable or disable the first and second power gates in accordance with an active operation mode of the load, wherein the control system comprises:
a feedback mechanism coupled to the gated grid, wherein the feedback mechanism is to provide a first output; and
an amplifier to receive the first output and to compare the first output with a reference signal, wherein the amplifier is to provide a second output,
wherein the second output is coupled to the first and second power gates.

22. The apparatus of claim 21, wherein the second output is to directly or indirectly cause the selectively enabling or disabling of the first and second power gates.

23. The apparatus of claim 21, wherein the reference signal is a reference voltage.

24. An apparatus, comprising:
a first power supply rail;
a second power supply rail;
a first transistor which is to couple the first power supply rail to the second power supply rail;
a second transistor which is to couple the first power supply rail to the second power supply rail;
a load to receive power from the second power supply rail; and
a circuitry to selectively enable or disable the first and second transistors according to active operation mode of the load.

25. The apparatus of claim 24, wherein the circuitry comprises:
a feedback circuitry coupled to the second power supply rail, wherein the feedback circuitry is to provide a first output.

26. The apparatus of claim 25, wherein the control system comprises:
an amplifier to receive the first output and to compare the first output with a reference, wherein the amplifier is to provide a second output, and wherein the second output is coupled to the first and second transistors.

27. The apparatus of claim 26, wherein the second output is to directly or indirectly cause the selectively enabling or disabling of the first and second transistors.

* * * * *